United States Patent
Huang

(10) Patent No.: US 10,886,948 B2
(45) Date of Patent: Jan. 5, 2021

(54) METHOD FOR DETERMINING A DECODING TASK AND APPARATUS

(71) Applicant: Huawei Technologies Co., Ltd., Shenzhen (CN)

(72) Inventor: Zefeng Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 109 days.

(21) Appl. No.: 16/219,465

(22) Filed: Dec. 13, 2018

(65) Prior Publication Data
US 2019/0123766 A1    Apr. 25, 2019

Related U.S. Application Data

(63) Continuation of application No. PCT/CN2017/087651, filed on Jun. 9, 2017.

(30) Foreign Application Priority Data

Jun. 14, 2016 (CN) .......................... 2016 1 0421035

(51) Int. Cl.
G06F 9/451 (2018.01)
H03M 13/29 (2006.01)
(Continued)

(52) U.S. Cl.
CPC ...... H03M 13/2948 (2013.01); G06F 9/4881 (2013.01); G06F 16/957 (2019.01); H03M 13/6502 (2013.01)

(58) Field of Classification Search
CPC .......... H03M 13/2948; H03M 13/6502; G06F 16/957; G06F 9/4881; G06F 9/451
(Continued)

(56) References Cited

U.S. PATENT DOCUMENTS 6,173,316 B1 *  1/2001  De Boor ........... H04M 1/72522
                                                        709/218
7,444,577 B2 * 10/2008  Best .................... G11C 11/406
                                                        365/201
(Continued)

FOREIGN PATENT DOCUMENTS

CN           101188770 A        5/2008
CN           101540656 A        9/2009
(Continued)

OTHER PUBLICATIONS

Bui et al., "Rethinking Energy-Performance Trade-Off in Mobile Web Page Loading," pp. 14-26, XP55394224 (Sep. 7-11, 2015).
(Continued)

*Primary Examiner* — Albert Decady
*Assistant Examiner* — Enam Ahmed
(74) *Attorney, Agent, or Firm* — Leydig, Voit & Mayer, Ltd.

(57) ABSTRACT

A method for determining a decoding task and an apparatus are disclosed. The method includes: obtaining to-be-loaded content of a to-be-rendered page; obtaining a decoding duration of the to-be-loaded content; determining a target decoding task queue based on the decoding duration of the to-be-loaded content, where a sum of decoding durations of decoding tasks included in the target decoding task queue is less than a threshold; and executing the decoding tasks included in the target decoding task queue. According to the method, a consumed time of an entire rendering process can be made to be within an expected range, for example, within 16 ms, thereby effectively improving page rendering smoothness and improving user experience.

17 Claims, 6 Drawing Sheets

(51) Int. Cl.
  *G06F 16/957* (2019.01)
  *G06F 9/48* (2006.01)
  *H03M 13/00* (2006.01)
(58) Field of Classification Search
  USPC .......................................................... 714/721
  See application file for complete search history.

(56) References Cited

U.S. PATENT DOCUMENTS

| | | | |
|---|---|---|---|
| 9,558,159 B1* | 1/2017 | Thirupparangiri | G06T 11/60 |
| 2002/0049969 A1* | 4/2002 | Duquesnois | H04N 7/52 |
| | | | 725/38 |
| 2002/0095639 A1* | 7/2002 | Ahmed | H03M 13/6502 |
| | | | 714/786 |
| 2010/0281334 A1* | 11/2010 | Budin | H03M 13/612 |
| | | | 714/755 |
| 2011/0113304 A1* | 5/2011 | Heinrich | H03M 13/6343 |
| | | | 714/763 |
| 2011/0242135 A1* | 10/2011 | Koshimae | H04N 1/0045 |
| | | | 345/637 |
| 2012/0093218 A1 | 4/2012 | Chang et al. | |
| 2012/0260137 A1* | 10/2012 | Berke | G11C 29/02 |
| | | | 714/721 |
| 2015/0193299 A1* | 7/2015 | Hyun | G11C 29/52 |
| | | | 714/6.24 |

FOREIGN PATENT DOCUMENTS

| | | |
|---|---|---|
| CN | 102867026 A | 1/2013 |
| CN | 103237255 A | 8/2013 |
| CN | 103678526 A | 3/2014 |
| CN | 104168509 A | 11/2014 |
| CN | 105338358 A | 2/2016 |
| CN | 105389159 A | 3/2016 |
| WO | 2015078211 A1 | 6/2015 |
| WO | 2016011886 A1 | 1/2016 |

OTHER PUBLICATIONS

Silly-Chetto, "Dynamic acceptance of aperiodic tasks with periodic tasks under resource sharing constraints," IEEE Proceedings—Software vol. 146, Issue 2, XP6013705, pp. 120-127 (Apr. 1999).

* cited by examiner

METHOD FOR DETERMINING A DECODING TASK AND APPARATUS

CROSS-REFERENCE TO RELATED APPLICATIONS

This application is a continuation of International Application No. PCT/CN2017/087651, filed on Jun. 9, 2017, which claims priority to Chinese Patent Application No. 201610421035.1, filed on Jun. 14, 2016. The disclosures of the aforementioned applications are hereby incorporated by reference in their entireties.

TECHNICAL FIELD

This application relates to the field of page rendering technologies, and more specifically, to a method for determining a decoding task and an apparatus.

BACKGROUND

With development of communications technologies, users more frequently use web applications (Web Apps) or browsers of clients to perform operations such as page browsing. One of important performance indexes of page browsing is a page rendering speed. A higher rendering speed indicates a higher page display speed and higher smoothness of browsing a page by a user. During page browsing, page browsing smoothness is used as an important measurement index of user experience. A key factor for the smoothness is a frame rate. An ideal frame rate is 60 frames/second, that is, 60 frames are rendered within one second. In other words, a consumed time of an entire rendering process of one frame needs to be maintained within 16 ms (milliseconds).

A browser is used as an example. The browser presents, in a form of a web page, a network resource selected by a user. This process is usually referred to as a page rendering process. The rendering process mainly includes the following several aspects: entering, by the user, a website; sending, by the browser, a request to a server; transmitting, by a server end, a Hypertext Markup Language (HTML) and a cascading style sheet (CSS) to the browser; and parsing, by the browser, the HTML and the CSS to generate a document object model (DOM) tree, generating a rendering tree (Render Tree) based on the DOM tree, generating a layer tree (Layer Tree) based on the rendering tree, and plotting an image onto a screen through layout and drawing. A prerequisite of generating the image and plotting the image onto the screen is decoding the image.

For a rendering process of one frame of page image, a key factor for a consumed time of the entire rendering process is a decoding duration of the frame of page image. In an existing rendering technology, a consumed time of a decoding task in each rendering process is not fixed. In this case, a consumed time of the entire rendering process is not fixed, either, and is usually greater than 16 ms. As a result, it is very difficult for a frame rate of the rendering process to reach 60 frames/second, frame freezing occurs, and user experience is relatively poor.

SUMMARY

This application provides a method for determining a decoding task and apparatus, to control a decoding duration of a rendering process to be within a threshold, and further control a consumed time of the entire rendering process to be within an expected range, for example, within 16 ms, thereby improving page rendering smoothness and user experience.

According to a first aspect, a method for determining a decoding task is provided. The method includes:
obtaining to-be-loaded content of a to-be-rendered page; obtaining a decoding duration of the to-be-loaded content; determining a target decoding task queue based on the decoding duration of the to-be-loaded content, where a sum of decoding durations of decoding tasks included in the target decoding task queue is less than a threshold; and executing the decoding tasks included in the target decoding task queue.

It should be understood that the decoding durations are specific for the decoding tasks and the decoding tasks are generated based on the to-be-loaded content.

In this technical solution of this application, the target decoding task queue of a rendering process is determined by obtaining the decoding duration of the to-be-loaded content. The sum of the decoding durations of the decoding tasks included in the target decoding task queue is less than the threshold, so that a consumed time of the entire rendering process is also within an expected range, for example, within 16 ms. This can improve user experience. Therefore, in this technical solution of this application, page rendering smoothness can be effectively improved, thereby improving user experience.

In the foregoing implementation, specifically, the decoding duration of the to-be-loaded content may be obtained through calculation by using a calculation method; or the decoding duration of the to-be-loaded content may be directly obtained by using a method such as table lookup.

With reference to the first aspect, in a first possible implementation of the first aspect, the obtaining a decoding duration of the to-be-loaded content includes: obtaining the decoding duration of the to-be-loaded content based on an attribute of the to-be-loaded content. The attribute of the to-be-loaded content includes at least one of the following attributes: a size and a pixel value of a decoding area corresponding to the to-be-loaded content.

With reference to the first possible implementation of the first aspect, in a second possible implementation of the first aspect, the obtaining the decoding duration of the to-be-loaded content based on an attribute of the to-be-loaded content includes: obtaining the decoding duration of the to-be-loaded content based on the attribute of the to-be-loaded content and a correspondence between the attribute and the decoding duration.

Specifically, the correspondence is pre-established. For example, the pre-established correspondence includes: a pixel value a×b is corresponding to a decoding duration t1, where the decoding duration t1 indicates a decoding duration required for the pixel value a×b within a unit decoding area, for example, a unit of the decoding duration t1 is (ms/cm$^2$); and a pixel value c×d is corresponding to a decoding duration t2, where the decoding duration t2 indicates a decoding duration required for the pixel value c×d within the unit decoding area, for example, a unit of the decoding duration t2 is (ms/cm$^2$). It is assumed that the pixel value of the decoding area corresponding to the to-be-loaded content is a×b, and it can be learned, based on a known page resolution, that the size of the decoding area is s1 (a unit is, for example, cm$^2$); in this case, the decoding duration corresponding to the to-be-loaded content is equal to a product of t1 and s1. For another example, the pixel value of the decoding area corresponding to the to-be-loaded content is x×y, it can be learned, based on a known page resolution, that the size of the decoding area is s2 (a unit is, for example, $cm^2$), and it is assumed that no matched value corresponding to x and y can be found in the correspondence. In this case, based on the correspondence, a decoding duration tx corresponding to the pixel value x×y may be obtained through calculation by using a method such as mathematical fitting or interpolation. The decoding duration tx indicates a decoding duration required for the pixel value x×y within a unit decoding area. For example, a unit of the decoding duration tx is ($ms/cm^2$). The decoding duration corresponding to the to-be-loaded content is calculated by multiplying tx and s2.

In the foregoing implementation, the correspondence may be in a form of a static table, or may be implemented by using program code.

In the foregoing implementation, a manner of obtaining the decoding duration of the to-be-loaded content based on the correspondence may be a table lookup manner, a mathematical fitting manner, a mathematical interpolation manner, or a combination of the foregoing plurality of manners.

In this technical solution of this application, the decoding duration of the to-be-loaded content is calculated by using the correspondence between the attribute of the to-be-loaded content and the decoding duration of the to-be-loaded content. Therefore, a calculation time of the decoding duration can be shortened, thereby shortening a total consumed time of an entire rendering process.

With reference to the second possible implementation of the first aspect, in a third possible implementation of the first aspect, the correspondence is a hardware decoding capability table.

Specifically, the hardware decoding capability table is used to indicate decoding performance of a decoder. For example, header line elements of the hardware decoding capability table include a pixel value and a decoding duration. The hardware decoding capability table may be obtained based on experience, or may be obtained by using an experimental method.

With reference to any one of the first aspect, or the first to the third possible implementations of the first aspect, in a fourth possible implementation of the first aspect, the determining a target decoding task queue based on the decoding duration of the to-be-loaded content includes:
generating an initial decoding task queue based on the to-be-loaded content, where all decoding tasks included in the initial decoding task queue are corresponding to all decoding requirements of the to-be-loaded content; and
determining the target decoding task queue based on decoding durations of the decoding tasks in the initial decoding task queue, where a sum of the decoding durations of the decoding tasks included in the initial decoding task queue is greater than or equal to the sum of the decoding durations of the decoding tasks included in the target decoding task queue.

With reference to the fourth possible implementation of the first aspect, in a fifth possible implementation of the first aspect, the sum of the decoding durations of the decoding tasks included in the initial decoding task queue is greater than the sum of the decoding durations of the decoding tasks included in the target decoding task queue, a quantity of the decoding tasks included in the initial decoding task queue is greater than or equal to a quantity of the decoding tasks included in the target decoding task queue, and the method further includes: adding, to a residual decoding task queue, a remaining decoding task in the initial decoding task queue that is not added to the target decoding task queue, so that a decoding task in the residual decoding task queue is to be preferentially processed in a next rendering process.

In this technical solution of this application, the remaining decoding task is added to the residual decoding task queue, so that the remaining decoding task is to be preferentially processed in the next rendering process. This can improve efficiency of the next rendering process, thereby improving a frame rate of page rendering as a whole.

With reference to any one of the first aspect, or the first to the fifth possible implementations of the first aspect, in a sixth possible implementation of the first aspect, a sum of the threshold and another consumed time is less than or equal to 16 ms, where the another consumed time is a total consumed time of other tasks, excluding the decoding tasks, in a rendering process of the to-be-rendered page.

In this technical solution of this application, the target decoding task queue of the rendering process is determined by calculating the decoding duration of the to-be-loaded content. The sum of the decoding durations of the decoding tasks included in the target decoding task queue is less than the threshold, the sum of the threshold and the other duration is not greater than 16 ms, and the other duration indicates the total consumed time of the other tasks, excluding the decoding tasks, in the entire rendering process, in other words, a consumed time of the entire rendering process is also within 16 ms. In this case, a frame rate of page rendering reaches 60 frames/second and is stable. This can effectively improve page displaying smoothness, thereby improving user experience.

With reference to any one of the first aspect, or the first to the sixth possible implementations of the first aspect, in a seventh possible implementation of the first aspect, the executing the decoding tasks included in the target decoding task queue includes:
executing, by using two threads, the decoding tasks included in the target decoding task queue.

Specifically, the decoding tasks included in the target decoding task queue are executed concurrently by using the two threads. This can effectively shorten a consumed time for executing the decoding tasks.

With reference to any one of the first aspect, or the first to the seventh possible implementations of the first aspect, in an eighth possible implementation of the first aspect, the method is applied to a scenario of page browsing in a web application (Web app) or a browser.

With reference to any one of the first aspect, or the first to the eighth possible implementations of the first aspect, in a ninth possible implementation of the first aspect, after the corresponding decoding tasks are executed, the method further includes: drawing and rendering decoded content, and displaying the decoded content onto a screen.

The foregoing implementations may be implemented by a rendering engine. Specifically, the obtaining to-be-loaded content of a to-be-rendered page may be performed by a rendering thread; the step of calculating a decoding duration of the to-be-loaded content and determining a target decoding task queue based on the decoding duration of the to-be-loaded content may be performed by a decoding task generation module; and the step of executing corresponding decoding tasks according to the target decoding task queue may be performed by a decoding thread.

In the foregoing implementations, the to-be-loaded content includes content that is not decoded; or the to-be-loaded content includes both content that is not decoded and content that has been decoded. For example, a user first performs an up-to-down flick operation on a page, and then performs a down-to-up flick operation. In a down-to-up flick process, content on a screen needs to be reloaded. The to-be-loaded content in this process includes both content that is not decoded and content that has been decoded (has been stored in a cache). If the to-be-loaded content includes the content that has been coded, the decoding duration of the to-be-loaded content in the foregoing implementations is a decoding duration of the content that is not decoded in the to-be-loaded content.

In the foregoing implementations, when a sum of consumed times of a plurality of decoding tasks is calculated, another processing method may be further considered, for example, weights of the decoding tasks, or a sum obtained after the consumed times of the decoding tasks are rounded.

In the foregoing implementations, in a process of executing the decoding tasks included in the target decoding task queue, specifically, the decoding tasks in the target decoding task queue are executed in sequence according to the queue.

According to a second aspect, a rendering engine is provided. The rendering engine is configured to execute the method in the first aspect or any possible implementation of the first aspect.

Specifically, the rendering engine may include modules configured to execute the method in the first aspect or any possible implementation of the first aspect.

The rendering engine provided in this application determines a target decoding task queue of a rendering process by calculating a decoding duration of to-be-loaded content. A sum of decoding durations of decoding tasks included in the target decoding task queue is less than a threshold, so that a consumed time of the entire rendering process is also within an expected range, for example, within 16 ms. This can effectively improve page rendering smoothness, thereby improving user experience.

According to a third aspect, a terminal device is provided. The terminal device includes a storage and a processor. The storage is configured to store an instruction. The processor is configured to execute the instruction stored in the storage. Execution of the instruction stored in the storage causes the processor to perform the method in the first aspect or any possible implementation of the first aspect.

The terminal device provided in this application determines a target decoding task queue of a rendering process by calculating a decoding duration of to-be-loaded content. A sum of decoding durations of decoding tasks included in the target decoding task queue is less than a threshold, so that a consumed time of the entire rendering process is also within an expected range, for example, within 16 ms. This can effectively improve page rendering smoothness, thereby improving user experience.

According to a fourth aspect, a computer readable storage medium is provided. The computer readable storage medium stores an instruction. The instruction includes an instruction of which execution causes one or more processors to perform an operation in the first aspect or any possible implementation of the first aspect.

In the technical solutions of this application, the target decoding task queue of the rendering process is determined by calculating the decoding duration of the to-be-loaded content. The sum of the decoding durations of the decoding tasks included in the target decoding task queue is less than the threshold, so that a consumed time of the entire rendering process is also within an expected range, for example, within 16 ms. This can improve user experience. Therefore, in the technical solutions of this application, page rendering smoothness can be effectively improved, thereby improving user experience.

DESCRIPTION OF EMBODIMENTS

The following describes the embodiments of the present disclosure with reference to accompanying drawings.

Figure 1:
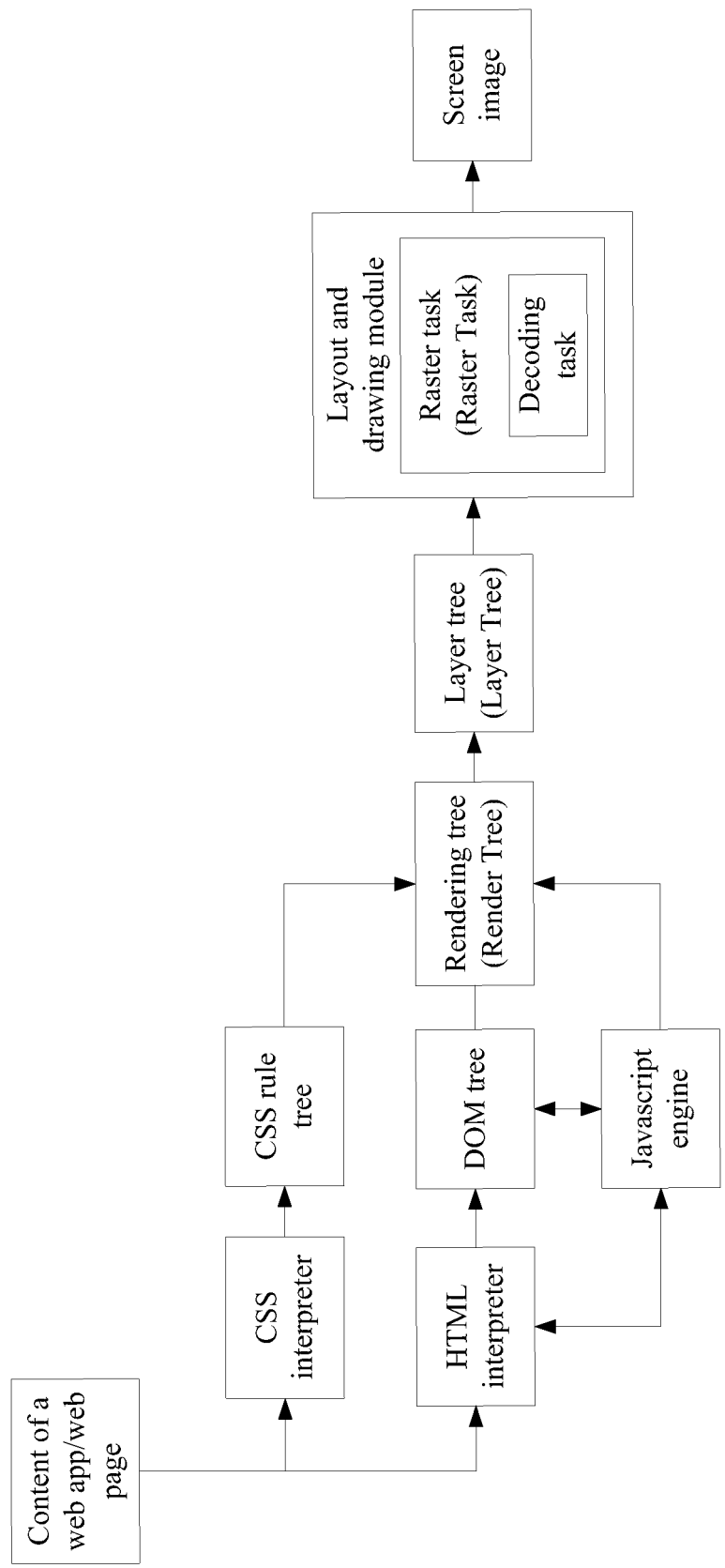
FIG. 1 is a schematic diagram of an application scenario according to an embodiment of the present disclosure.

For ease of understanding and describing a method for determining a decoding task provided in the embodiments of the present disclosure, a page rendering process is first described briefly with reference to FIG. 1. It can be learned from FIG. 1 that a rendering process mainly relates to an HTML interpreter, a CSS interpreter, a JavaScript engine, a layout module, and a drawing module. HTML is a Hypertext Markup Language interpreter. The HTML interpreter is an interpreter that interprets the HTML language, and is configured to interpret an HTML text into a document object model (DOM) tree. CSS is a cascading style sheet. The CSS interpreter is an interpreter that interprets a style sheet, and is configured to add style information to each element object in the DOM tree, so as to provide a basis for calculating a layout of a final result. The JavaScript engine can modify web page content, and can also modify information about the CSS interpreter. The JavaScript engine interprets JavaScript code, and applies logic of the code and modification information of the DOM and the CSS to the layout, so as to change a rendering result.

A typical rendering process is shown in FIG. 1. Content of a web app or a web page is sent to an HTML interpreter. The HTML interpreter interprets the content of the web app or the web page to form a DOM tree. If there is JavaScript code in the interpretation process, the JavaScript code is to be processed by a JavaScript engine. If the content of the web app or the web page includes a CSS, the CSS is to be parsed by a CSS interpreter. During establishment of a DOM, style information from the CSS interpreter is received, a rendering tree (Render Tree) is constructed, and a layer tree (Layer Tree) is generated based on the rendering tree. A layout module calculates location and size information of each element of the layer tree. Finally, a drawing module completes plotting from the layer tree to an image.

In a layout and drawing process, a prerequisite of generating the image and plotting the image onto a screen is decoding the image. In the layout and drawing process, a raster task is generated. In the raster task, a decoding task queue is generated. In the prior art, the decoding task queue in the raster task is generated based on layer-tree information. In the decoding task queue generated in this way, a quantity of included decoding tasks is not fixed, and decoding durations of all decoding tasks are not fixed and are not the same. Therefore, a decoding duration required for all decoding tasks included in the decoding task queue is not fixed.

It should be understood that, for a rendering process, a sum of decoding durations of decoding tasks included in the rendering process is an important factor affecting a consumed time of the entire rendering process. According to a prior-art decoding-task generation solution, the consumed time of the entire rendering process is not fixed and is usually greater than 16 ms. As a result, it is difficult to ensure a frame rate of 60 frames/second, a frame freezing phenomenon occurs easily, and user experience is relatively poor.

For the foregoing technical problem, the embodiments of the present disclosure provide a method for determining a decoding task and an apparatus, to effectively improve page rendering smoothness, thereby improving user experience.

Figure 2:
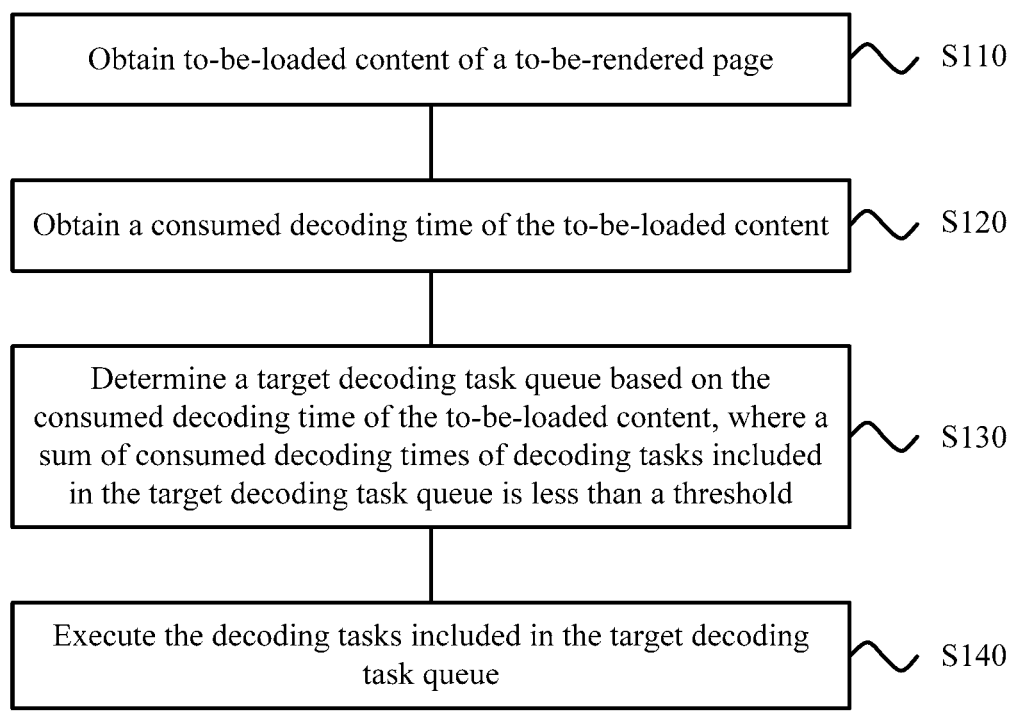
FIG. 2 is a schematic flowchart of a method for determining a decoding task according to an embodiment of the present disclosure.

FIG. 2 is a schematic flowchart of a method for determining a decoding task 100 according to an embodiment of the present disclosure. The method 100 is executed by, for example, a rendering engine. The method 100 includes the following steps.

S110. Obtain to-be-loaded content of a to-be-rendered page.

Specifically, the to-be-loaded content is obtained based on the layer tree shown in FIG. 1. The to-be-loaded content includes but is not limited to other content displayed on the page, for example, a picture, an icon, and a control.

S120. Obtain a decoding duration of the to-be-loaded content.

Specifically, the decoding duration of the to-be-loaded content is a consumed time required for decoding the to-be-loaded content.

The decoding duration of the to-be-loaded content may be obtained by using a mathematical calculation method, or the decoding duration of the to-be-loaded content may be directly obtained in a manner such as table lookup.

Optionally, in this embodiment of the present disclosure, the decoding duration of the to-be-loaded content is obtained based on an attribute of the to-be-loaded content. The attribute of the to-be-loaded content includes at least one of the following attributes: a size and a pixel value of a decoding area corresponding to the to-be-loaded content.

S130. Determine a target decoding task queue based on the decoding duration of the to-be-loaded content, where a sum of decoding durations of decoding tasks included in the target decoding task queue is less than a threshold.

Specifically, a sum of the threshold and another consumed time is less than or equal to 16 ms, and the another consumed time is a total consumed time of other tasks, excluding the decoding tasks, in a rendering process of the to-be-rendered page. For example, the another consumed time includes a total consumed time of an HTML parsing process, a DOM tree generation process, a rendering tree generation process, a layer tree generation process, and a process of plotting and rendering a decoded image and displaying the decoded image on a screen in FIG. 1. In other words, it is assumed that a consumed time T of the entire rendering process satisfies T=t1+t2, where t1 is the total consumed time of the decoding tasks executed in the rendering process, and t2 is the total consumed time for processing the other tasks, excluding the decoding tasks, in the rendering process. It should be understood that t2 is relatively fixed. Therefore, T can maintain within an expected range provided that t1 is less than the threshold. In this embodiment of the present disclosure, T is less than or equal to 16 ms due to duration of t1. In this case, a consumed time of one rendering process is within 16 ms or is equal to 16 ms. This implements a frame rate of 60 frames/second for page rendering, and can meet a requirement of a user on page rendering smoothness.

S140. Execute the decoding tasks included in the target decoding task queue.

Specifically, the decoding tasks in the target decoding task queue are executed according to their sequences in the queue.

In this embodiment of the present disclosure, the target decoding task queue of the rendering process is determined by calculating the decoding duration of the to-be-loaded content. The sum of the decoding durations of the decoding tasks included in the target decoding task queue is less than the threshold, so that a consumed time of an entire rendering process is also within an expected range, for example, within 16 ms. This can improve user experience. Therefore, in this embodiment of the present disclosure, page rendering smoothness can be effectively improved, thereby improving user experience.

Optionally, in this embodiment of the present disclosure, S120 in which the decoding duration of the to-be-loaded content is obtained includes: obtaining the decoding duration of the to-be-loaded content based on an attribute of the to-be-loaded content and a correspondence between the attribute and the decoding duration. The attribute of the to-be-loaded content includes at least one of the following attributes: a size and a pixel value of a decoding area corresponding to the to-be-loaded content.

Specifically, the correspondence includes a correspondence between a pixel value and a decoding duration. For example, the correspondence includes: a pixel value a×b is corresponding to a decoding duration t1, where the decoding duration t1 indicates a decoding duration required for the pixel value a×b within a unit decoding area, for example, a unit of the decoding duration t1 is (ms/cm$^2$); and a pixel value c×d is corresponding to a decoding duration t2, where the decoding duration t2 indicates a decoding duration required for the pixel value c×d within the unit decoding area, for example, a unit of the decoding duration t2 is (ms/cm$^2$). The decoding duration of the to-be-loaded content may be calculated based on the correspondence and the attribute of the to-be-loaded content by using a method such as matching, mathematical fitting, or mathematical interpolation. For example, the pixel value of the decoding area corresponding to the to-be-loaded content is a×b, and it can be learned, based on a known page resolution, that the size of the decoding area is s1 (a unit is, for example, cm$^2$). In this case, the decoding duration corresponding to the to-be-loaded content is equal to a product of t1 (ms/cm$^2$) and s1 (cm$^2$). For another example, the pixel value of the decoding area corresponding to the to-be-loaded content is x×y, it can be learned, based on a known page resolution, that the size of the decoding area is s2 (a unit is, for example, cm$^2$), and it is assumed that no matched value corresponding to x and y can be found in the correspondence. In this case, based on the correspondence, a decoding duration tx corresponding to the pixel value x×y may be obtained through calculation by using a method such as mathematical fitting or interpolation. The decoding duration tx indicates a decoding duration required for the pixel value x×y within a unit decoding area. For example, a unit of the decoding duration tx is (ms/cm$^2$). In this case, the decoding duration corresponding to the to-be-loaded content is equal to a product of tx (ms/cm$^2$) and s2 (cm$^2$).

It should be understood that all the decoding durations in the correspondences listed in the examples in this embodiment of the present disclosure are decoding durations within a unit area, for example, decoding durations within an area of 1 cm². However, this embodiment of the present disclosure is not limited thereto. Optionally, in this embodiment of the present disclosure, the correspondence includes that a pixel value is corresponding to a decoding duration T, where the decoding duration indicates a decoding duration required for the pixel value within a decoding area of a size. For example, if the decoding area of the size is 5 cm², a unit of the decoding duration T is (ms/5 cm²).

Specifically, in this embodiment of the present disclosure, the correspondence includes a correspondence between a pixel value, a decoding area size, and a decoding duration. For example, the correspondence includes that a pixel value e×f and a decoding area size s3 (a unit is, for example, cm²) are corresponding to a decoding duration t3. The decoding duration t3 indicates a decoding duration required for the pixel value e×f within the decoding area s3, and a unit of the decoding duration t3 is (ms/s3 cm²). It is assumed that the pixel value of the decoding area corresponding to the to-be-loaded content is e×f. It can be learned, based on the known page resolution, that the size of the decoding area is exactly s3 cm², and the decoding duration of the to-be-loaded content may be directly obtained based on the correspondence and is t3 ms.

Therefore, in this embodiment of the present disclosure, based on the correspondence, the decoding duration of the to-be-loaded content may be obtained by using a particular calculation process. In a case, the decoding duration of the to-be-loaded content may alternatively be directly obtained based on the correspondence. In summary, based on the correspondence, the decoding duration of the to-be-loaded content can be obtained efficiently.

Specifically, the correspondence may be presented in a form of a static table, or may be implemented by using program code.

Optionally, in this embodiment of the present disclosure, the correspondence is expressed as a hardware decoding capability table.

Specifically, as shown in Table 1, header line elements of the hardware decoding capability table include a pixel value and a decoding duration (a unit area is used as an example). For example, in the hardware decoding capability table, a decoding duration corresponding to a pixel value 1280× 1500 is 2 (ms/cm²); a decoding duration corresponding to a pixel value 1280×2000 is 3 (ms/cm²). Assuming that a pixel value of a decoding task is 1280×1500 and a size of a decoding area corresponding to the decoding task is 2 cm², a decoding duration of the decoding task is calculated as follows: 2(ms/cm²)×2 cm²=4 ms.

TABLE 1

| Pixel value | Decoding duration (ms/cm²) |
|---|---|
| 1280 × 1500 | 2 |
| 1280 × 2000 | 3 |

In this embodiment of the present disclosure, the hardware decoding capability table may be stored on a local storage medium or may be stored on a remote storage medium through network access.

It should be understood that Table 1 is used as an example rather than limitation. A decoding duration stored in the hardware decoding capability table in this embodiment of the present disclosure may be a decoding duration required for the unit area, or may be a decoding duration required for an area of any size. Specifically, a definition of the decoding duration in the hardware decoding capability table may be determined based on a specific performance requirement. This is not limited in this embodiment of the present disclosure. For example, the decoding duration in the hardware decoding capability table indicates a decoding duration required for an area of 5 cm², and a unit corresponding to the decoding duration is (ms/5 cm²).

It should be further understood that a header line of the hardware decoding capability table in this embodiment of the present disclosure may further include a decoding area size. To be specific, the header line of the hardware decoding capability table includes three entries: the pixel value, the decoding area size, and the decoding duration. In this case, the decoding duration indicates a decoding duration required for the pixel value within an area indicated by the decoding area size.

Optionally, in this embodiment of the present disclosure, S130 in which the target decoding task queue is determined based on the decoding duration of the to-be-loaded content includes: generating an initial decoding task queue based on the to-be-loaded content, where all decoding tasks included in the initial decoding task queue are corresponding to all decoding requirements of the to-be-loaded content; calculating decoding durations of the decoding tasks in the initial decoding task queue, where specifically, a decoding duration of each decoding task in the initial decoding task queue is calculated based on a size and a pixel value of a decoding area corresponding to the decoding task; and determining the target decoding task queue based on the decoding durations of the decoding tasks in the initial decoding task queue, where a sum of the decoding durations of the decoding tasks included in the initial decoding task queue is greater than or equal to the sum of the decoding durations of the decoding tasks included in the target decoding task queue.

Specifically, tile division is performed on the to-be-loaded content of the to-be-rendered page. After the tile division, a plurality of tiles are obtained. Each tile is corresponding to one or more decoding tasks. If one tile includes a plurality of decoding tasks, a small decoding task queue is generated by using the tile as a unit. Finally, decoding tasks corresponding to all the tiles obtained through division form the initial decoding task queue. It should be understood that a tile may be corresponding to a part of a picture, may be exactly corresponding to a complete picture, may be corresponding to a combination of a plurality of complete pictures, may be corresponding to a combination of parts of a plurality of pictures, or may be corresponding to a combination of parts of m pictures and m complete pictures. The decoding tasks corresponding to all the tiles obtained through division form the initial decoding task queue in top-down, left-to-right order on a screen page. It should be understood that the decoding tasks in the initial decoding task queue include all the decoding requirements of the to-be-loaded content of the to-be-rendered page. Then, in the initial decoding task queue, decoding tasks meeting a threshold condition are selected as the target decoding task queue. Specifically, the decoding durations of the decoding tasks are accumulated one by one from the end of the initial decoding task queue, and when an accumulated value nearly exceeds the threshold, decoding tasks on which accumulation is performed at this time are added to the target decoding task queue. It should be noted that, that an accumulated value nearly exceeds the threshold means that a corresponding accumulated value exceeds the threshold if a decoding duration of one more decoding task is accumulated. The target decoding task queue obtained by using the foregoing method ensures that the total decoding duration of the decoding tasks included in the target decoding task queue is less than the threshold.

Therefore, in this embodiment of the present disclosure, the target decoding task queue of the rendering process is determined by calculating the decoding duration of the to-be-loaded content. The sum of the decoding durations of the decoding tasks included in the target decoding task queue is less than the threshold, so that the consumed time of the entire rendering process is also within the expected range, for example, within 16 ms. This can effectively improve page rendering smoothness, thereby improving user experience.

Figure 3:
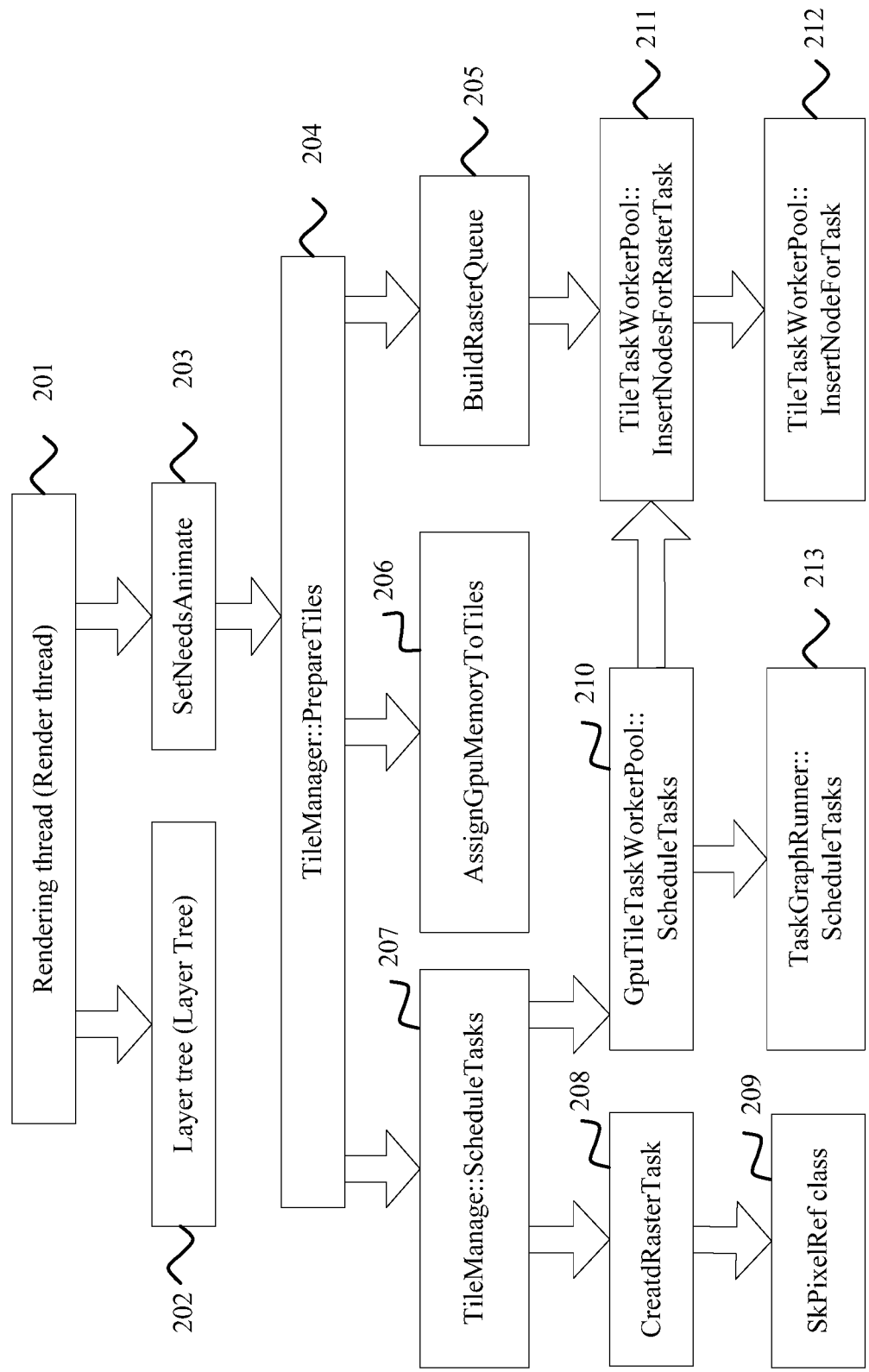
FIG. 3 is another schematic flowchart of a method for determining a decoding task according to an embodiment of the present disclosure.

The following describes the method in the embodiments of the present disclosure by using an example in which an application scenario of the embodiments of the present disclosure is a page flicking scenario of a web application (Web App). Specifically, for example, the web app is a gallery application on a smartphone. It should be understood that the gallery application is an application written by using a web. It should be understood that, in a scenario of the gallery application, an object to be decoded is a picture. In this case, the decoding task in the method 100 may be expressed as a picture decoding task. The gallery application is developed based on an animation framework and runs on a chromium rendering kernel. In a flicking process of a gallery, as shown in FIG. 3, the following layout and plotting steps are included in an entire rendering process.

A rendering thread (Render Thread) 201 cyclically triggers rebuilding of a layer tree 202 by using a message loop mechanism, determines whether a current operation performed by a user on a screen page is a flicking operation, and if yes, triggers execution of SetNeedsAnimate 203. In SetNeedsAnimate 203, TileManager is notified of the flicking process of the gallery. In other words, the rendering thread 201 notifies a compositor that the layer tree has been updated, so that the compositor performs a compositional display operation. Specifically, after receiving a notification from the rendering threshold 201, the compositor triggers TileManager to execute PrepareTiles 204.

In PrepareTiles 204, BuildRasterQueue 205 is called. BuildRasterQueue 205 is used to perform tile division based on the layer tree 202 to generate a plurality of tiles, and generate a raster queue based on the plurality of tiles.

In PrepareTiles 204, AssignGpuMemoryToTiles 206 is further called. AssignGpuMemoryToTiles 206 is used to calculate and allocate memory.

In PrepareTiles 204, ScheduleTasks 207 of TileManager is further called. In ScheduleTasks 207, CreatdRasterTask 208 is called. CreatdRasterTask 208 is used to generate a picture decoding task.

In the CreatdRasterTask 208, an SkPixelRef class 209 is called. Data information such as a pixel value or a size of a to-be-decoded picture in each generated tile can be obtained by using the SkPixelRef class 209. Then, a plurality of decoding tasks are generated based on the data information. Decoding durations required for these decoding tasks may be obtained by querying a hardware decoding capability table. Finally, decoding tasks of all the tiles form an initial decoding task queue.

Specifically, the hardware decoding capability table may be a sheet maintained in the smartphone in this embodiment of the present disclosure. Header elements of the hardware decoding capability table are, for example, a picture pixel value and a decoding duration/a unit decoding area, or are, for example, a picture pixel value, a picture size, and a decoding duration.

The hardware decoding capability table may be determined based on a decoding capability of hardware in the smartphone.

In ScheduleTasks 207, after CreatdRasterTask 208 is called, a ScheduleTasks function 210 of GpuTileTaskWorkerPool is called. In the ScheduleTasks function 210 of GpuTileTaskWorkerPool, an InsertNodesForRasterTask function 211 is first called. The InsertNodesForRasterTask function 211 is used to maintain an initial decoding task queue. Specifically, the InsertNodesForRasterTask function 211 is used to form, based on the picture decoding task obtained by the CreatdRasterTask 208, the initial decoding task queue in top-down, left-to-right order on the page. Then, based on a decoding duration obtained in CreatdRasterTask 208, a decoding task meeting a threshold condition is selected from the initial decoding task queue. Specifically, decoding durations of decoding tasks are accumulated one by one from the end of the initial decoding task queue, and when an accumulated value nearly exceeds a threshold, decoding tasks on which accumulation is performed at this time are used as decoding tasks to be executed in this rendering process. It should be noted that, that an accumulated value nearly exceeds a threshold means that a corresponding accumulated value exceeds the threshold if a decoding duration of one more decoding task is accumulated. Specifically, the decoding task meeting the threshold condition ensures that an overall consumed time of this rendering process is within 16 ms.

In the ScheduleTasks function 210 of GpuTileTaskWorkerPool, after the InsertNodesForRasterTask function 211 is called, an InsertNodeForTask function 212 of TileTaskWorkerPool is called. The InsertNodeForTask function 212 of TileTaskWorkerPool is used to place the decoding task meeting the threshold condition in the initial decoding task queue into a decoding task queue to be finally executed (corresponding to the target decoding task queue in the embodiments of the present disclosure).

In the ScheduleTasks function 210 of GpuTileTaskWorkerPool, after the InsertNodesForRasterTask function 212 is called, ScheduleTasks 213 of TaskGraphRunner is called. The ScheduleTasks 213 of TaskGraphRunner is used to enable a thread to execute a decoding task in the decoding task queue to be finally executed (namely, the target decoding task queue).

Finally, the rendering thread performs composition processing and drawing processing on a decoded picture, and finally renders a processed picture on a screen.

Specifically, if the rendering thread 201 determines that the current operation performed by the user on the screen page is not a flicking operation, it is determined that a gallery enabling scenario or a gallery preview scenario is currently available. In this case, all to-be-loaded pictures on the current page need to be decoded at a time.

Specifically, in InsertNodeForTask 212 of TileTaskWorkerPool, if there are remaining decoding tasks in the initial decoding task queue after the decoding task meeting the threshold condition in the initial decoding task queue is placed into the decoding task queue to be finally executed (corresponding to the target decoding task queue in the embodiments of the present disclosure), these remaining decoding tasks may be placed into a residual decoding task queue. The decoding tasks in the residual decoding task queue are to be preferentially processed in a next rendering process.

The method in the embodiments of the present disclosure may also be applied to a flicking scenario of a browser. The process shown in FIG. 3 may also be applicable to the flicking scenario of the browser. However, it should be noted that, in the flicking scenario of the browser, a task scheduler, instead of the rendering thread 201, triggers TileManager once at a given interval. In addition, in the flicking scenario of the browser, a residual decoding task queue needs to be maintained in TileTaskWorkerPool. If there are remaining decoding tasks in an initial decoding task queue after a decoding task meeting a threshold condition in the initial decoding task queue is placed into a task queue to be finally executed, these remaining decoding tasks are placed into the residual decoding task queue. If determining that the residual decoding task queue is not empty, TileTaskWorkerPool maintaining the residual decoding task queue instructs the task scheduler to continue to trigger TileManager.

Optionally, in this embodiment of the present disclosure, if a page flicking scenario (for example, the flicking scenario of the browser) cannot be determined, page flicking is determined by monitoring whether a residual decoding task queue is empty. If it is determined that the residual decoding task queue is not empty, it is determined that a page flicking scenario is currently available, and execution of a rendering process is triggered.

Application scenarios of the method for determining a decoding task in this embodiment of the present disclosure include a flicking scenario of a web application (Web App) and a flicking scenario of a browser. The method for determining a decoding task in this embodiment of the present disclosure may be specifically applied to a smartphone, or may be applied to another intelligent terminal device, for example, a tablet computer or a personal computer (PC).

It should be understood that FIG. 3 uses a chromium rendering kernel as an example to describe the method for determining a decoding task provided in this embodiment of the present disclosure, and this embodiment of the present disclosure is not limited thereto. For example, this embodiment of the present disclosure may also be implemented based on Crosswalk that is an open-source web engine.

Figure 4:
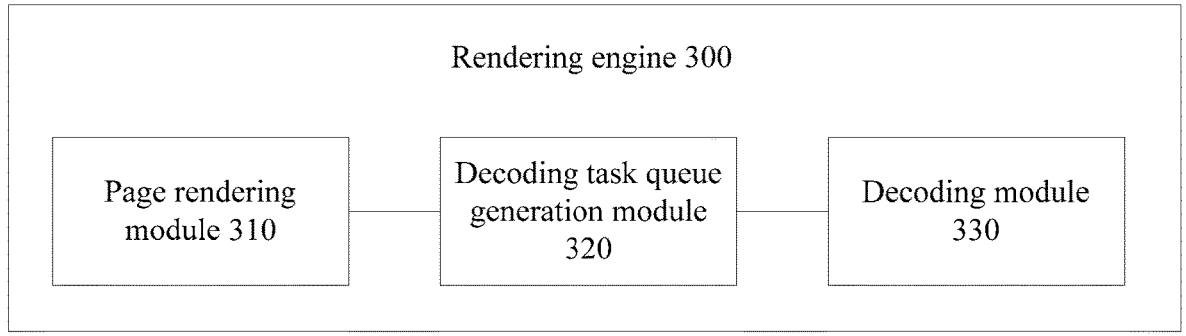
FIG. 4 is a schematic block diagram of a rendering engine according to an embodiment of the present disclosure.

FIG. 4 is a schematic block diagram of a rendering engine 300 according to an embodiment of the present disclosure. The rendering engine 300 includes:
 a page rendering module 310, configured to obtain to-be-loaded content of a to-be-rendered page;
 a decoding task queue generation module 320, configured to: obtain a decoding duration of the to-be-loaded content, and determine, based on the decoding duration of the to-be-loaded content, a target decoding task queue, where a sum of decoding durations of decoding tasks included in the target decoding task queue is less than a threshold; and
 a decoding module 330, configured to execute the decoding tasks included in the target decoding task queue.

Therefore, the rendering engine provided in this embodiment of the present disclosure determines the target decoding task queue of a rendering process by calculating the decoding duration of the to-be-loaded content. The sum of the decoding durations of the decoding tasks included in the target decoding task queue is less than the threshold, so that a consumed time of the entire rendering process is also within an expected range, for example, within 16 ms. This can effectively improve page rendering smoothness, thereby improving user experience.

Optionally, in this embodiment of the present disclosure, the decoding task queue generation module is specifically configured to obtain the decoding duration of the to-be-loaded content based on an attribute of the to-be-loaded content. The attribute of the to-be-loaded content includes at least one of the following attributes: a size and a pixel value of a decoding area corresponding to the to-be-loaded content.

Optionally, in this embodiment of the present disclosure, the decoding task queue generation module is specifically configured to obtain the decoding duration of the to-be-loaded content based on the attribute of the to-be-loaded content and a correspondence between the attribute and the decoding duration.

Optionally, in this embodiment of the present disclosure, the correspondence is a hardware decoding capability table.

Optionally, in this embodiment of the present disclosure, the decoding task queue generation module is specifically configured to: generate an initial decoding task queue based on the decoding duration of the to-be-loaded content, where all decoding tasks included in the initial decoding task queue are corresponding to all decoding requirements of the to-be-loaded content; and determine the target decoding task queue based on the initial decoding task queue, where a sum of decoding durations of the decoding tasks included in the initial decoding task queue is greater than or equal to the sum of the decoding durations of the decoding tasks included in the target decoding task queue.

Optionally, in this embodiment of the present disclosure, a sum of the threshold and another consumed time is less than or equal to 16 ms, and the another consumed time is a total consumed time of other tasks, excluding the decoding tasks, in a rendering process of the to-be-rendered page.

Optionally, in this embodiment of the present disclosure, the decoding module includes two decoding threads. The two decoding threads are configured to execute the decoding tasks in the target decoding task queue.

An embodiment of the present disclosure further provides a computer readable storage medium. The computer readable storage medium stores an instruction. The instruction includes an instruction of which execution causes one or more processors to perform an operation in the method for determining a decoding task provided in the embodiments of the present disclosure.

It should be understood that applying the computer readable storage medium provided in this embodiment of the present disclosure to a terminal device can improve page rendering smoothness effectively, thereby improving user experience.

Figure 5:
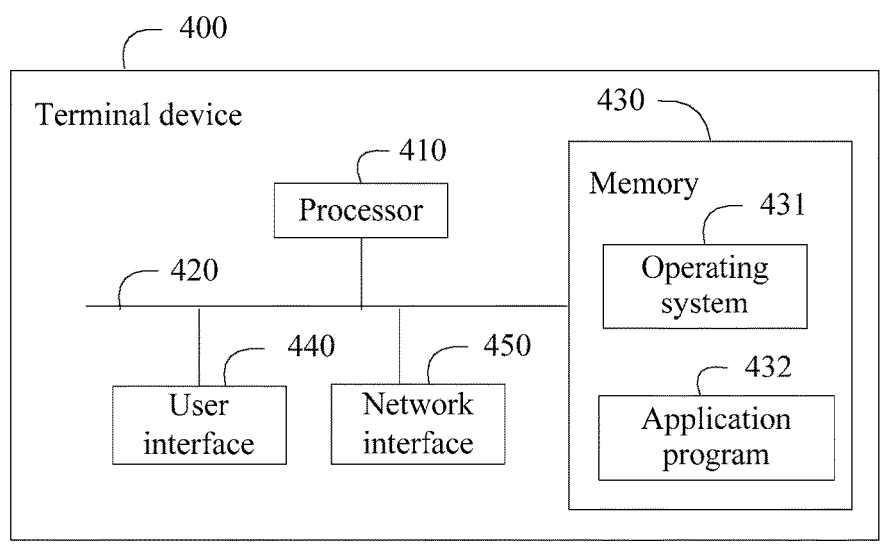
FIG. 5 is a schematic block diagram of a terminal device according to an embodiment of the present disclosure.

FIG. 5 is a schematic structural block diagram of a terminal device 400 according to an embodiment of the present disclosure. The terminal device 400 includes at least one processor 410, at least one network interface 450 or user interface 440, a memory 430, and at least one internal communications link 420. The internal communications link 420 is configured to implement a connection and communication between the foregoing components. The memory 430 stores the following element: an executable module or a data structure, or a subset thereof, or an extended set thereof:
 an operating system 431 that includes various system programs and is configured to implement various basic services and process a hardware-based task; and
 an application program 432 that includes a web app and a browser, may further include other various application programs, and is configured to implement various application services.

Optionally, the user interface 440 included in the terminal device 400 includes a display (for example, a touchscreen, an LCD (liquid crystal display), a CRT (cathode ray tube), holographic imaging device, or a projector), a keyboard, or a pointer device (for example, a mouse, a trackball, a tactile plate, or a touchscreen).

The memory 430 may include a read-only memory and a random access memory, and provide an instruction and data to the processor 410. A part of the memory 430 may further include a non-volatile random access memory (NVRAM).

In this embodiment of the present disclosure, by calling a program or an instruction stored in the memory 430, the processor 410 is configured to:

obtain to-be-loaded content of a to-be-rendered page; obtain a decoding duration of the to-be-loaded content; determine a target decoding task queue based on the decoding duration of the to-be-loaded content, where a sum of decoding durations of decoding tasks included in the target decoding task queue is less than a threshold; and execute the decoding tasks included in the target decoding task queue.

Therefore, the terminal device provided in this embodiment of the present disclosure determines the target decoding task queue of a rendering process by calculating the decoding duration of the to-be-loaded content. The sum of the decoding durations of the decoding tasks included in the target decoding task queue is less than the threshold, so that a consumed time of the entire rendering process is also within an expected range, for example, within 16 ms. This can improve user experience. Therefore, in this embodiment of the present disclosure, page rendering smoothness can be effectively improved, thereby improving user experience.

Specifically, a sum of the threshold and another consumed time is less than or equal to 16 ms, and the another consumed time is a total consumed time of other tasks, excluding the decoding tasks, in a rendering process of the to-be-rendered page.

Optionally, in an embodiment, the processor 410 is configured to obtain the decoding duration of the to-be-loaded content based on an attribute of the to-be-loaded content. The attribute of the to-be-loaded content includes at least one of the following attributes: a size and a pixel value of a decoding area corresponding to the to-be-loaded content.

Optionally, in an embodiment, the processor 410 is configured to obtain the decoding duration of the to-be-loaded content based on the attribute of the to-be-loaded content and a correspondence between the attribute and the decoding duration.

Specifically, the correspondence is a hardware decoding capability table.

Optionally, in an embodiment, the processor 410 is configured to: generate an initial decoding task queue based on the decoding duration of the to-be-loaded content, where all decoding tasks included in the initial decoding task queue are corresponding to all decoding requirements of the to-be-loaded content; and determine the target decoding task queue based on the initial decoding task queue, where a sum of decoding durations of the decoding tasks included in the initial decoding task queue is greater than or equal to the sum of the decoding durations of the decoding tasks included in the target decoding task queue.

In addition, the terminal device 600 may further execute the methods and the embodiments in FIG. 2 and FIG. 3. Details are not described in this embodiment of the present disclosure.

Therefore, the terminal device provided in this embodiment of the present disclosure determines the target decoding task queue of the rendering process by calculating the decoding duration of the to-be-loaded content. The sum of the decoding durations of the decoding tasks included in the target decoding task queue is less than the threshold, so that a consumed time of the entire rendering process is also within an expected range, for example, within 16 ms. This can improve user experience. Therefore, in this embodiment of the present disclosure, page rendering smoothness can be effectively improved, thereby improving user experience.

The method for determining a decoding task in the embodiments of the present disclosure may be applied to an Android system, may be applied to an iPhone operating system (iOS system), or may be applied to any web operating system.

Figure 6:
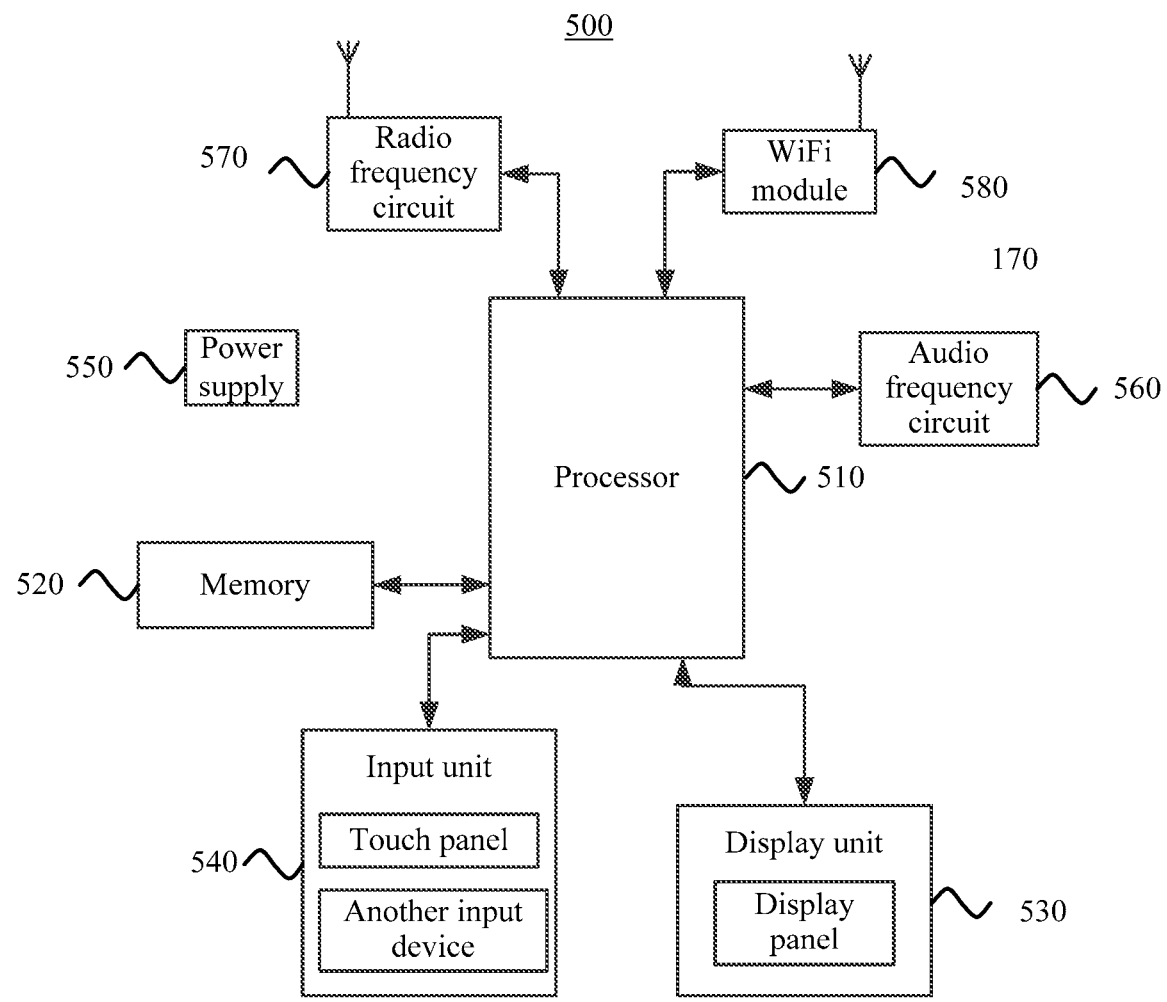
FIG. 6 is another schematic block diagram of a terminal device according to an embodiment of the present disclosure.

As shown in FIG. 6, an embodiment of the present disclosure further provides a terminal device 500. The terminal device 500 includes a processor 510 and a memory 520. The memory 520 is configured to store an instruction or a program. The processor 510 is configured to execute the instruction or the program stored in the memory 520. Execution of the instruction or the program stored in the memory 520 causes the processor 510 to: obtain to-be-loaded content of a to-be-rendered page; obtain a decoding duration of the to-be-loaded content; determine a target decoding task queue based on the decoding duration of the to-be-loaded content, where a sum of decoding durations of decoding tasks included in the target decoding task queue is less than a threshold; and execute the decoding tasks included in the target decoding task queue.

As shown in FIG. 6, the terminal device 500 further includes a display unit 530. The display unit 530 may be configured to display information entered by a user or information provided to a user, and various menu interfaces of the terminal 500. In this embodiment of the present disclosure, the display unit 530 is specifically configured to display a rendering result of the to-be-rendered page. Specifically, the processor 510 is configured to compose decoded information into an image (e.g., a picture) after executing the decoding tasks included in the target decoding task queue; and the display unit 530 is configured to display the composed image. The display unit 530 may include a display panel. Optionally, the display panel may be configured by using a liquid crystal display (LCD), an organic light-emitting diode (OLED), or a like form.

As shown in FIG. 6, the terminal device 500 further includes an input unit 540, configured to receive a signal indicating that the user flicks a screen page. Specifically, the processor 510 is configured to obtain the to-be-loaded content of the to-be-rendered page based on the signal indicating that the user flicks the screen page. Specifically, in this embodiment of the present disclosure, the input unit 540 may include a touch panel. The touch panel, also referred to as a touchscreen, may collect a touch operation performed by the user on or near the touch panel (such as an operation performed by the user on or near the touch panel by using a finger or any proper object or accessory such as a stylus), and drive a corresponding connection apparatus according to a preset program. Optionally, the touch panel may include two parts: a touch detection apparatus and a touch controller. The touch detection apparatus detects a touch orientation of the user, detects a signal brought by the touch operation, and transfers the signal to the touch controller. The touch controller receives touch information from the touch detection apparatus, converts the touch information into touch point coordinates, and sends the touch point coordinates to the processor 510, and can receive and execute a command sent by the processor 510. In addition, the touch panel may be implemented in various types, such as a resistive type, a capacitive type, an infrared type, and a surface acoustic wave type. In addition to the touch panel, the input unit 540 may further include another input device. The another input device may include but is not limited to one or more of a physical keyboard, a function key (such as a volume control key or an on/off key), a trackball, a mouse, a joystick, and the like.

Optionally, as shown in FIG. 6, the terminal device 500 further includes a power module 550, an audio frequency circuit 560, a radio frequency circuit 570, a WiFi module 580, and the like. The power module 550 is configured to supply power to the terminal device 500. The audio frequency circuit 560 is configured to provide an audio frequency function. The radio frequency circuit 570 is configured to emit a radio electromagnetic wave, and is usually a to-be-modulated high-frequency carrier. The WiFi module 580 is configured to implement a wireless Internet access function of the terminal device 500.

Specifically, the terminal device 500 may be, for example, a mobile phone, a tablet computer, a personal digital assistant (PDA), a point of sales (POS), or a vehicular computer.

Figure 7:
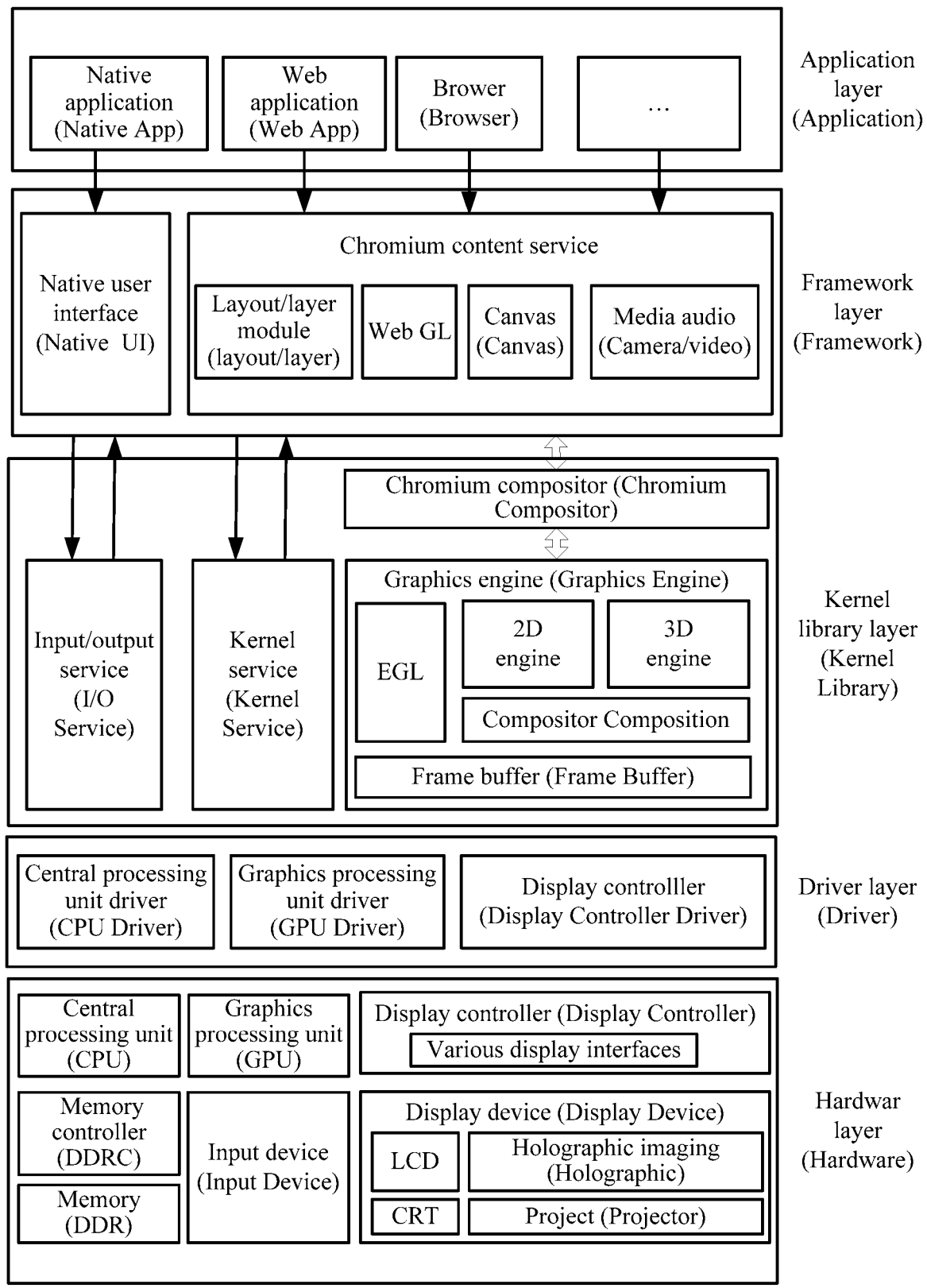
FIG. 7 is still another schematic block diagram of a terminal device according to an embodiment of the present disclosure.

FIG. 7 is used as an example. A logical structure of a computing node to which the method for determining a decoding task in the embodiments of the present disclosure is applied is described. The computing node may be a terminal device. The terminal device may be specifically a smartphone.

As shown in FIG. 7, a hardware layer of the terminal device includes a central processing unit (CPU), a graphics processing unit (GPU), and the like, and may further include a storage, an input/output device, a memory, a memory controller, a network interface, and the like. The input device may include a keyboard, a mouse, a touchscreen, and the like. The output device may include a display device such as a liquid crystal display (LCD), a cathode-ray tube (CRT) display, holographic imaging device, and a projector.

An operating system (such as, e.g., Android) and some application programs may run above the hardware layer.

A kernel library layer is a core part of the operating system, and includes an input/output service, a core service, a graphics device interface, graphics engines implementing CPU and GPU graphics processing, and the like. The graphics engines may include a 2D engine, a 3D engine, a compositor, a frame buffer, an Embedded-System Graphics Library (EGL), and the like. The EGL is an interface between a rendering API and a bottom-layer original platform window system, and the API is an application programming interface.

In addition, the terminal further includes a driver layer (Driver), a framework layer (Framework), and an application layer (Application).

The driver layer may include a CPU driver, a GPU driver, a display controller driver, and the like.

The application layer mainly includes a native application (Native App), a web application (Web App), and a browser (Browser), and may further include some media player applications (Media Player), and the like.

The framework layer mainly includes a native user interface (Native User Interface, Native UI) module and a chromium content service. The chromium content service may include a layout/layer (layout/layer) module, a web GL (Web Graphics Library), a canvas (Canvas), media audio (Camera/video), and the like.

The native UI at the framework layer is interconnected with the native App at the application layer, and the chromium content service at the framework layer is interconnected with the web app and the browser at the application layer.

The framework layer (Framework) is interconnected with the kernel library layer (Kernel Library) by using a chromium compositor (Chromium Compositor) module. The chromium compositor module is specifically Compositor/Chromium-ui/Skia. The web app and the browser at the application layer are interconnected with the kernel library layer by using the chromium content service, and are specifically interconnected with 2D and 3D graphics systems. The steps of the method for determining a decoding task in the embodiments of the present disclosure mainly exist in a rendering process in which the web app and the browser are interconnected with the kernel library layer by using the chromium content service.

It should be understood that operations to be implemented by code corresponding to the method for determining a decoding task in the embodiments of the present disclosure include: parsing content of the web app or the browser to generate a layer tree (Layer Tree), generating a tile (Tile) queue based on the layer tree, generating a target decoding task queue based on the tile (Tile) queue, and decoding a decoding task in the target decoding task queue. Therefore, the code in the embodiments of the present disclosure is implemented in a related module in the chromium content service at the framework layer shown in FIG. 5. It should also be understood that code for performing composition based on decoded information to generate a screen image is implemented in a module related to graphic composition at the kernel library layer.

It should be understood that, for a logical structure of an execution body of the method in the embodiments of the present disclosure, refer to FIG. 7.

Therefore, in this embodiment of the present disclosure, the target decoding task queue of the rendering process is determined by calculating the decoding duration of the to-be-loaded content. The sum of the decoding durations of the decoding tasks included in the target decoding task queue is less than the threshold, so that a consumed time of the entire rendering process is also within an expected range, for example, within 16 ms. This can effectively improve page rendering smoothness, thereby improving user experience.

It should be understood that, in the embodiments of this application, sequence numbers of the foregoing processes do not mean an execution order, whereas the execution order of the processes should be determined based on functions and internal logic of the processes and should not impose any limitation on an implementation process of this application.

A person of ordinary skill in the art may be aware that, units and algorithm steps in the examples described with reference to the embodiments disclosed in this specification can be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for specific working processes of the foregoing system, apparatus, and unit, refer to corresponding processes in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or may not be performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located in one position, or may be distributed on a plurality of network units. Some or all of the units may be selected depending on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method for determining a decoding task, comprising:
    obtaining, by one or more processors, to-be-loaded content of a to-be-rendered page for display on a display device;
    obtaining, by the one or more processors, a decoding duration of the to-be-loaded content;
    determining, by the one or more processors, a target decoding task queue based on the decoding duration of the to-be-loaded content, wherein each of one or more decoding tasks in the target decoding task queue has a corresponding decoding duration, and wherein a sum of decoding durations of the one or more decoding tasks comprised in the target decoding task queue is less than a threshold; and
    executing, by the one or more processors, the one or more decoding tasks comprised in the target decoding task queue;
    wherein the determining the target decoding task queue based on the decoding duration of the to-be-loaded content comprises:
        generating an initial decoding task queue based on the to-be-loaded content, wherein each decoding task comprised in the initial decoding task queue corresponds to each decoding requirement of the to-be-loaded content; and
        determining the target decoding task queue based on decoding durations of the decoding tasks in the initial decoding task queue, wherein a sum of the decoding durations of the decoding tasks comprised in the initial decoding task queue is greater than or equal to the sum of the decoding durations of the one or more decoding tasks comprised in the target decoding task queue.

2. The method according to claim 1, wherein the obtaining the decoding duration of the to-be-loaded content comprises:
    obtaining the decoding duration of the to-be-loaded content based on an attribute of the to-be-loaded content, wherein the attribute of the to-be-loaded content comprises at least one of the following attributes: a size value and a pixel value of a decoding area corresponding to the to-be-loaded content.

3. The method according to claim 2, wherein the obtaining the decoding duration of the to-be-loaded content based on the attribute of the to-be-loaded content comprises:
    obtaining the decoding duration of the to-be-loaded content based on the attribute of the to-be-loaded content and a correspondence between the attribute and the decoding duration of the to-be-loaded content.

4. The method according to claim 3, wherein the correspondence is a hardware decoding capability table.

5. The method according to claim 1, wherein a sum of the threshold and another time value is less than or equal to 16 ms (milliseconds), wherein the another time value is a total consumed time of other tasks, excluding the one or more decoding tasks, in a rendering process of the to-be-rendered page.

6. The method according to claim 1, wherein the executing the one or more decoding tasks provides page browsing in a web application or a browser.

7. A rendering engine in an electronic device, comprising:
    one or more processors configured to:
        obtain to-be-loaded content of a to-be-rendered page;
        obtain a decoding duration of the to-be-loaded content;
        determine a target decoding task queue based on the decoding duration of the to-be-loaded content, wherein each of one or more decoding tasks in the target decoding task queue has a corresponding decoding duration, and wherein a sum of decoding durations of the one or more decoding tasks comprised in the target decoding task queue is less than a threshold; and
        execute the one or more decoding tasks comprised in the target decoding task queue;
    wherein determining the target decoding task queue based on the decoding duration of the to-be-loaded content comprises:
        generating an initial decoding task queue based on the to-be-loaded content, wherein each decoding task comprised in the initial decoding task queue corresponds to each decoding requirement of the to-be-loaded content; and
        determining the target decoding task queue based on decoding durations of the decoding tasks in the initial decoding task queue, wherein a sum of the decoding durations of the decoding tasks comprised in the initial decoding task queue is greater than or equal to the sum of the decoding durations of the one or more decoding tasks comprised in the target decoding task queue.

8. The rendering engine according to claim 7, wherein the obtaining the decoding duration of the to-be-loaded content is based on an attribute of the to-be-loaded content, wherein the attribute of the to-be-loaded content comprises at least one of the following attributes: a size value and a pixel value of a decoding area corresponding to the to-be-loaded content.

9. The rendering engine according to claim 8, wherein the obtaining the decoding duration of the to-be-loaded content is based on the attribute of the to-be-loaded content and a correspondence between the attribute and the decoding duration of the to-be-loaded content.

10. The rendering engine according to claim 9, wherein the correspondence is a hardware decoding capability table.

11. The rendering engine according to claim 7, wherein a sum of the threshold and another time value is less than or equal to 16 ms (milliseconds), wherein the another time value is a total consumed time of other tasks, excluding the one or more decoding tasks, in a rendering process of the to-be-rendered page.

12. The rendering engine according to claim 7, wherein the executing the one or more decoding tasks comprises executing two decoding threads, wherein the two decoding threads are configured to execute the one or more decoding tasks comprised in the target decoding task queue.

13. A computer, comprising:
a memory storing instructions; and
a processor configured to execute the instructions to cause the processor to:
obtain to-be-loaded content of a to-be-rendered page;
obtain a decoding duration of the to-be-loaded content;
determine a target decoding task queue based on the decoding duration of the to-be-loaded content, wherein each of one or more decoding tasks in the target decoding task queue has a corresponding decoding duration, and wherein a sum of decoding durations of the one or more decoding tasks comprised in the target decoding task queue is less than a threshold; and
execute the one or more decoding tasks comprised in the target decoding task queue,
wherein determining the target decoding task queue based on the decoding duration of the to-be-loaded content comprises:
generating an initial decoding task queue based on the to-be-loaded content, wherein each decoding task comprised in the initial decoding task queue corresponds to each decoding requirement of the to-be-loaded content; and
determining the target decoding task queue based on decoding durations of the decoding tasks in the initial decoding task queue, wherein a sum of the decoding durations of the decoding tasks comprised in the initial decoding task queue is greater than or equal to the sum of the decoding durations of the one or more decoding tasks comprised in the target decoding task queue.

14. The computer according to claim 13, wherein the processor further configured to:
obtain the decoding duration of the to-be-loaded content based on an attribute of the to-be-loaded content, wherein the attribute of the to-be-loaded content comprises at least one of the following attributes: a size value and a pixel value of a decoding area corresponding to the to-be-loaded content.

15. The computer according to claim 14, wherein the processor further configured to:
obtain the decoding duration of the to-be-loaded content based on the attribute of the to-be-loaded content and a correspondence between the attribute and the decoding duration of the to-be-loaded content.

16. The computer according to claim 15, wherein the correspondence is a hardware decoding capability table.

17. The computer according to claim 13, wherein a sum of the threshold and another time value is less than or equal to 16 ms (milliseconds), wherein the another time value is a total consumed time of other tasks, excluding the one or more decoding tasks, in a rendering process of the to-be-rendered page.

* * * * *